US010566983B2

(12) United States Patent
Maki et al.

(10) Patent No.: US 10,566,983 B2
(45) Date of Patent: Feb. 18, 2020

(54) ATOMIC OSCILLATOR, ELECTRONIC APPARATUS, AND CONTROL METHOD

(71) Applicant: Seiko Epson Corporation, Tokyo (JP)

(72) Inventors: Yoshiyuki Maki, Suwa (JP); Noriaki Tanaka, Chino (JP)

(73) Assignee: Seiko Epson Corporation (JP)

( * ) Notice: Subject to any disclaimer, the term of this patent is extended or adjusted under 35 U.S.C. 154(b) by 112 days.

(21) Appl. No.: 15/685,293

(22) Filed: Aug. 24, 2017

(65) Prior Publication Data

US 2018/0069557 A1    Mar. 8, 2018

(30) Foreign Application Priority Data

Sep. 7, 2016 (JP) ................. 2016-174979

(51) Int. Cl.
  *H03L 7/26*      (2006.01)
  *G04F 5/14*     (2006.01)
  *H03L 7/099*    (2006.01)

(52) U.S. Cl.
  CPC ............ *H03L 7/26* (2013.01); *G04F 5/14* (2013.01); *H03L 7/099* (2013.01)

(58) Field of Classification Search
  CPC .................................................. H03L 7/26
  USPC ........................................................ 331/3
  See application file for complete search history.

(56) References Cited

U.S. PATENT DOCUMENTS

| 6,300,841 | B1 | 10/2001 | Atsumi et al. |
| 6,320,472 | B1 | 11/2001 | Vanier |
| 8,253,497 | B2* | 8/2012 | Aoyama ............. G04F 5/145 331/3 |
| 2013/0176081 | A1* | 7/2013 | Nishida ................ H03L 7/26 331/94.1 |
| 2018/0198456 | A1* | 7/2018 | Ishihara .............. H03L 7/26 |

FOREIGN PATENT DOCUMENTS

JP    2001-036405 A    2/2001

\* cited by examiner

*Primary Examiner* — Joseph Chang
(74) *Attorney, Agent, or Firm* — Harness, Dickey & Pierce, P.L.C.

(57) ABSTRACT

An atomic oscillator includes: an atomic cell in which alkali metal atoms are sealed; a light source that radiates first light and second light with different frequencies to the atomic cell; a light detector that detects the first light and the second light transmitted through the atomic cell and outputs a detection signal according to a detection intensity; a signal generator that generates a microwave signal according to a transition frequency between two ground levels of the alkali metal atoms based on a result obtained by detecting the detection signal for each first period; and a light source adjuster that adjusts the frequencies of the first light and the second light for each second period, the second period being longer than the first period.

4 Claims, 7 Drawing Sheets

ATOMIC OSCILLATOR, ELECTRONIC APPARATUS, AND CONTROL METHOD

BACKGROUND

1. Technical Field

The present invention relates to an atomic oscillator, an electronic apparatus, and a control method.

2. Related Art

Known oscillators having high long-term frequency stability include atomic oscillators that oscillate based on energy transition of atoms of alkali metals such as rubidium and cesium.

For example, an atomic oscillator disclosed in U.S. Pat. No. 6,320,472 includes a cell (atomic cell) in which a gaseous alkali metal is sealed, a semiconductor laser element that emits light to be radiated to the cell, and a light detector that detects the light transmitted through the cell. The atomic oscillator controls the driving of a semiconductor laser based on a detection result of the light detector.

In the atomic oscillator disclosed in U.S. Pat. No. 6,320,472, a current value input to the semiconductor laser varies with a variation in the installation environment of the atomic oscillator (for example, a disturbance such as a variation in temperature or a variation in a magnetic field). Accordingly, there is a problem that short-term frequency stability deteriorates.

SUMMARY

An advantage of some aspects of the invention is that it provides an atomic oscillator capable of reducing deterioration in short-term frequency stability even when an installation environment varies, and provides an electronic apparatus and a vehicle including the atomic oscillator.

The advantage can be achieved by the following representative configurations.

An atomic oscillator according to an aspect of the invention includes: an atomic cell in which alkali metal atoms are sealed; a light source that radiates first light and second light with mutually different frequencies to the atomic cell; a light detector that detects the first light and the second light transmitted through the atomic cell and outputs a detection signal according to a detection intensity; a signal generator that generates a microwave signal according to a transition frequency between two ground levels of the alkali metal atoms based on a result obtained by detecting the detection signal for each first period; and a light source adjuster that adjusts the frequencies of the first light and the second light for each second period longer than the first period.

In the atomic oscillator, by adjusting the frequencies of the first light and the second light, it is possible to reduce deterioration of short-term frequency stability due to a variation (disturbance) of the installation environment. By causing the period (the second period) at which the frequencies of the first light and the second light are adjusted to be longer than the period (the first period) at which the signal generator detects the detection signal, it is possible to reduce the deterioration in the short-term frequency stability due to the adjustment.

In the atomic oscillator according to the aspect of the invention, it is preferable that the light source adjuster includes a driving circuit that drives the light source by inputting a driving current obtained by superimposing a modulated current based on the microwave signal on a bias current to the light source and an automatic gain control circuit that adjusts an amplitude of the microwave signal for each third period longer than the first period.

With this configuration, by stabilizing the modulated current input to the light source, it is possible to reduce a variation in the short-term frequency stability due to a variation (disturbance) of an installation environment. By causing the period (the third period) at which the modulated current is adjusted to be longer than the period (the first period) at which the detection signal is detected at the time of generating a microwave signal, it is possible to reduce the deterioration in the short-term frequency stability due to the adjustment.

In the atomic oscillator according to the aspect of the invention, it is preferable that the light source adjuster includes a bias current adjuster that adjusts a current value of the bias current for each fourth period longer than the first period.

With this configuration, it is possible to stabilize a bias current input to the light source and reduce a variation in the short-term frequency stability due to the variation (disturbance) in the installation environment. By causing the period (the fourth period) at which the bias current is adjusted to be longer than the period (the first period) at which the detection signal is detected at the time of generating the microwave signal, it is possible to reduce the deterioration in the short-term frequency stability due to the adjustment.

In the atomic oscillator according to the aspect of the invention, it is preferable that the fourth period is shorter than the third period.

With this configuration, when linearity of the output characteristics of the light source with respect to the bias current is relatively high (nonlinearity is relatively low), it is possible to effectively reduce a variation in a central wavelength of the light from the light source. As a result, it is possible to improve stability of the wavelengths of the first light and the second light.

In the atomic oscillator according to the aspect of the invention, it is preferable that the fourth period is longer than the third period.

With this configuration, when the nonlinearity of the output characteristics of the light source with respect to the bias current is relatively high (the linearity is relatively low), it is possible to effectively reduce the variation in the central wavelength of the light from the light source unit. As a result, it is possible to improve stability of the wavelengths of the first light and the second light.

In the atomic oscillator according to the aspect of the invention, it is preferable that the second period is equal to or less than $(0.1/T)$ seconds when an installation environment temperature varies at a variation speed $T$ [° C./second].

With this configuration, it is possible to reduce the variation in the short-term frequency stability due to the variation in the installation environment temperature.

In the atomic oscillator according to the aspect of the invention, it is preferable that the first period is equal to or greater than $1/150$ seconds and equal to or less than $1/50$ seconds.

With this configuration, it is possible to generate a desired microwave signal.

In the atomic oscillator according to the aspect of the invention, it is preferable that the second period is equal to or less than 1 second.

With this configuration, it is possible to reduce the variation in the short-term frequency stability due to the variation in a general installation environment.

An atomic oscillator according to an aspect of the invention includes: an atomic cell in which alkali metal atoms are sealed; a light source that radiates light to the atomic cell; a light detector that detects the light transmitted through the atomic cell and outputs a detection signal according to a detection intensity; a signal generator that generates a microwave signal according to a transition frequency between two ground levels of the alkali metal atoms based on a result obtained by detecting the detection signal for each first period; an antenna that radiates a microwave to the atomic cell so that a signal based on the microwave signal is input; and a microwave adjuster that adjusts an amplitude of the microwave for each second period longer than the first period.

In the atomic oscillator, by adjusting the amplitude of the microwave, it is possible to reduce the deterioration in the short-term frequency stability due to a variation (disturbance) in the installation environment. By causing the period (the second period) at which the amplitude of the microwave is adjusted to be longer than the period (the first period) at which the signal generator detects a detection signal, it is possible to reduce the deterioration in the short-term frequency stability due to the adjustment.

An electronic apparatus according to an aspect of the invention includes the atomic oscillator according to the aspect of the invention.

In the electronic apparatus, it is possible to reduce the deterioration in the short-term frequency stability of the atomic oscillator even when the installation environment of the atomic oscillator varies. Therefore, by using a signal for high frequency stability regardless of the installation environment of the electronic apparatus, it is possible to achieve an improved function of the electronic apparatus.

A vehicle according to an aspect of the invention includes the atomic oscillator according to the aspect of the invention.

In the vehicle, it is possible to reduce the deterioration in the short-term frequency stability of the atomic oscillator even when the installation environment of the atomic oscillator varies. Therefore, by using a signal for high frequency stability regardless of the position of the vehicle, it is possible to realize an improved function of the vehicle.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, an atomic oscillator, an electronic apparatus, and a vehicle will be described in detail with reference to the appended drawings according to preferred embodiments.

1. Atomic Oscillator

First, an atomic oscillator will be described.

First Embodiment

Figure 1:
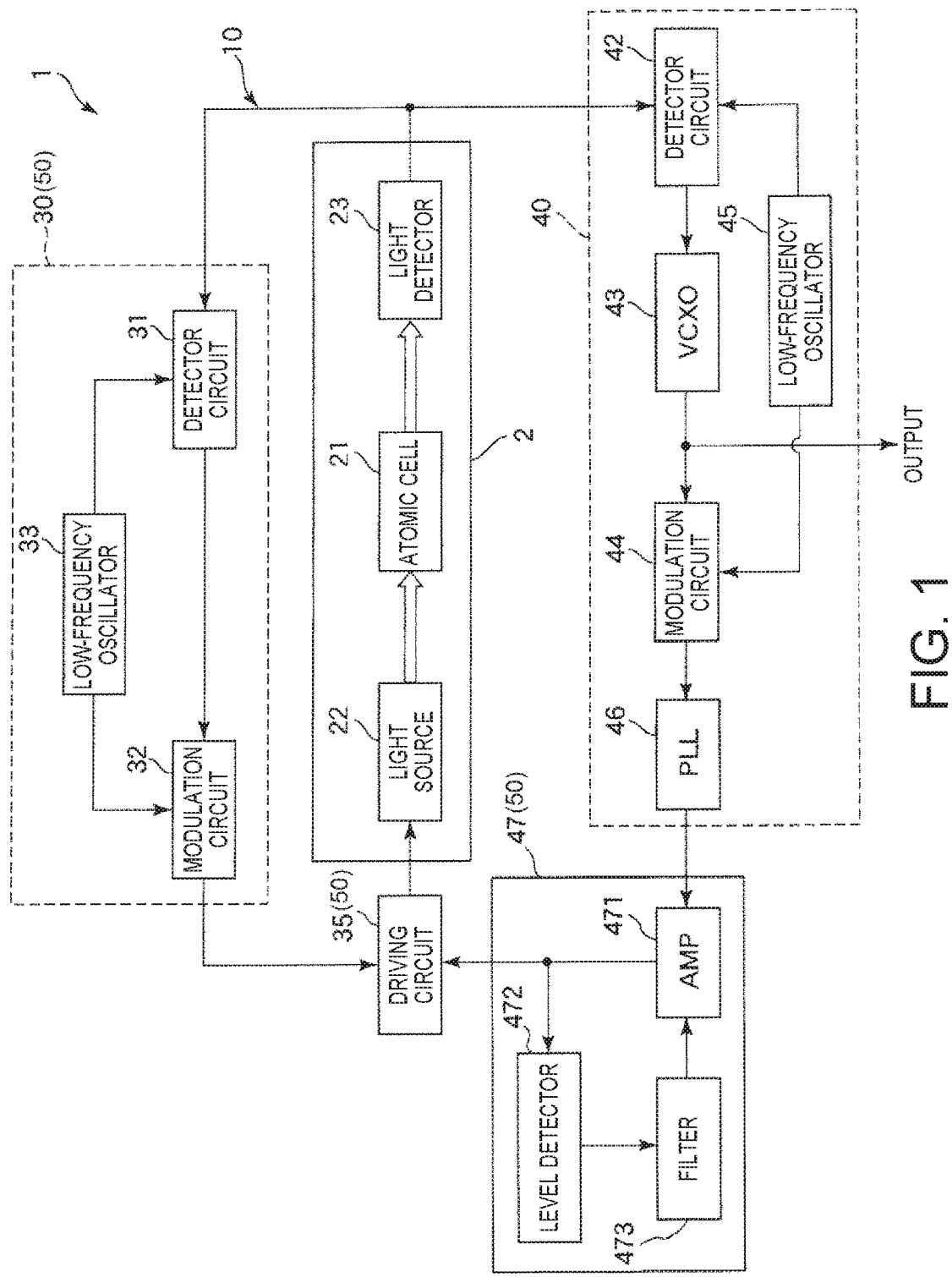
FIG. 1 is a schematic diagram illustrating an overall configuration of an atomic oscillator according to a first embodiment.

FIG. 1 is a schematic diagram illustrating an overall configuration of an atomic oscillator according to a first embodiment.

An atomic oscillator 1 illustrated in FIG. 1 is an atomic oscillator that uses coherent population trapping (CPT) in which a phenomenon occurs in which two pieces of resonance light are transmitted without being absorbed by alkali metal atoms when the two pieces of resonance light with specific different wavelengths are simultaneously radiated to the alkali metal atoms. The coherent population trapping phenomenon is also called the electromagnetically induced transparency (EIT) phenomenon.

As illustrated in FIG. 1, the atomic oscillator 1 includes a package unit 2 and a controller 10 that is electrically connected to the package unit 2. The package unit 2 includes a light source 22 (light source unit) that emits light, an atomic cell 21 (gas cell) in which, for example, alkali metal atoms such as rubidium atoms or cesium atoms are sealed, and a light detector 23 (light detection unit), which are accommodated in a package (not illustrated). The controller 10 includes a detector circuit 31, a modulation circuit 32, a low-frequency oscillator 33, a driving circuit 35, a detector circuit 42, a voltage controlled crystal oscillator 43 (VCXO), a modulation circuit 44, a low-frequency oscillator 45, a phase synchronization circuit 46 (Phase Locked Loop (PLL)), and an automatic gain control circuit 47 (automatic gain control amplifier (AGC)) which are installed outside of the package of the package unit 2. At least a part of the controller 10 may be accommodated inside the package unit 2.

Here, the driving circuit 35 supplies the light source 22 with a driving current obtained by superimposing a modulated current on a bias current. In this way, the light source 22 emits light with a central wavelength according to a current value of the bias current and two pieces of sideband light (first light and second light) with wavelengths deviating from the wavelength of the light on both sides of the wavelength by a wavelength according to a frequency of the modulated current. The two pieces of sideband light pass through the atomic cell 21 and are detected by the light detector 23. The detector circuit 31, the modulation circuit 32, and the low-frequency oscillator 33 function as a "bias current adjuster 30" that adjusts the current value of the bias current of the driving circuit 35 based on a detection result of the light detector 23. The detector circuit 42, the voltage controlled crystal oscillator 43, the modulation circuit 44, the low-frequency oscillator 45, and the phase synchronization circuit 46 function as a "signal generator 40" that generates a microwave signal according to a transition frequency between two ground levels of the alkali metal atoms inside the atomic cell 21 based on a detection result of the light detector 23. The signal generator 40 adjusts the frequency of the microwave signal to be used as the modulated current so that an EIT phenomenon is produced by the alkali metal atoms inside the atomic cell 21 and the above-described two pieces of sideband light, stabilizes an output signal of the voltage controlled crystal oscillator 43 (VCXO) at a predetermined frequency, and outputs the output signal as a clock signal of the atomic oscillator 1. The automatic gain control circuit 47 adjusts the amplitude of the modulated current (microwave signal) from the signal generator 40 and inputs the modulated current to the driving circuit 35. In the atomic oscillator 1, the driving circuit 35, the bias current adjuster 30, and the automatic gain control circuit 47 function as a "light source adjuster 50" that adjusts the frequencies of the above-described two pieces of sideband light (the first light and the second light).

Hereinafter, the units of the atomic oscillator 1 will be described sequentially.

Package Unit

The package unit 2 illustrated in FIG. 1 includes the light source 22 (the light source unit), the atomic cell 21 (gas cell), and the light detector 23 (light detection unit), as described above.

Light Source Unit

The light source 22 is supplied with the driving current obtained by superimposing the modulated current on the bias current and emits the above-described two pieces of sideband light as first light and second light with mutually different frequencies (wavelengths). The light source 22 may be a light source that has the above-described function. The invention is not particularly limited. For example, a semiconductor laser such as a vertical cavity surface emitting laser (VCSEL) can be exemplified.

Atomic Cell

An alkali metal (alkali metal atoms) such as rubidium, cesium, or sodium in a gaseous form is sealed inside the atomic cell 21. In the atomic cell 21, a noble gas such as argon or neon or an inert gas such as nitrogen may be sealed as a buffer gas along with the alkali metal gas, as necessary.

The alkali metal atom has energy levels of three level systems formed by two different ground levels (first and second ground levels) and an excited level. The first ground level is an energy level lower than the second ground level. Here, when resonance light (first resonance light) that has a frequency $\omega 1$ equivalent to an energy difference between the first ground level and the excited level and resonance light (second resonance light) that has a frequency $\omega 2$ equivalent to an energy difference between the second ground level and the excited level are radiated independently to the alkali metal atoms, light is absorbed. In contrast, when the first resonance light and the second resonance light (a pair of pieces of resonance light) are radiated simultaneously, an electromagnetically induced transparency (EIT) phenomenon occurs in which both the first resonance light and the second resonance light are transmitted without being absorbed in the alkali metal atoms.

The EIT phenomenon occurs when the first resonance light and the second resonance light are simultaneously radiated to the alkali metal atoms and a frequency difference ($\omega 1 - \omega 2$) between the frequency $\omega 1$ of the first resonance light and the frequency $\omega 2$ of the second resonance light matches a frequency $\omega 0$ equivalent to an energy difference $\Delta E$ between the first and second ground levels. Accordingly, optical absorptance (light transmittance) in the alkali metal atoms of the first resonance light and the second resonance light is changed according to the frequency difference ($\omega 1 - \omega 2$), the EIT phenomenon occurs when the frequency difference ($\omega 1 - \omega 2$) matches the frequency $\omega 0$, and the intensities of the first resonance light and the second resonance light transmitted through the alkali metal atoms are steeply increased. A steep signal generated by the EIT phenomenon is referred to as an EIT signal. The EIT signal has a fixed value decided according to a type of alkali metal atom. Therefore, by using the EIT signal as a standard, the high precise oscillator can be configured.

For example, when the alkali metal atoms are cesium atoms, the frequency $\omega 0$ equivalent to the energy difference $\Delta E$ is 9.1926 GHz. Therefore, when two types of light in which the frequency difference ($\omega 1 - \omega 2$) is 9.1926 GHz are simultaneously radiated to cesium atoms, the EIT signal is detected.

The atomic cell 21 is heated by a heater (not illustrated) driven based on a detection result of a temperature sensor (not illustrated) that detects the temperature of the atomic cell 21. In this way, the alkali metal in the atomic cell 21 can be maintained in a gaseous form of an appropriate density. For example, a magnetic field generator (not illustrated) that has a coil or the like applying a magnetic field to the alkali metal by conduction is installed near the atomic cell 21. According to the magnetic field from the magnetic field generator, a gap between a plurality of different energy levels at which the alkali metal atoms are degenerated can be spread by Zeeman splitting to improve a resolution. As a result, it is possible to improve precision of the oscillation frequency of the atomic oscillator 1.

Optical components such as a wavelength plate, a light reduction filter, a lens, and a polarization plate may be disposed between the light source 22 and the atomic cell 21 described above.

Light Detection Unit

The light detector 23 has a function of receiving and detecting the light (the first light and the second light) transmitted through the atomic cell 21 and outputting a detection signal according to the intensity of the detected light. The light detector 23 is not particularly limited as long as the intensity of the light described above can be detected. For example, a light detector (light-receiving element) such as a photodiode can be exemplified.

Controller

As described above, the controller 10 includes the bias current adjuster 30, the driving circuit 35, the signal generator 40, and the automatic gain control circuit 47.

Bias Current Adjuster

The bias current adjuster 30 includes the detector circuit 31, the modulation circuit 32, and the low-frequency oscillator 33. The detector circuit 31 synchronously detects an output signal of the light detector 23 at a low frequency of a few Hz to a few hundreds of Hz (for each fourth period) using an output signal (oscillation signal) of the low-frequency oscillator 33 oscillated at the frequency. The modulation circuit 32 modulates an output signal of the detector circuit 31 using an output signal (oscillation signal) of the low-frequency oscillator 33 as a modulation signal so that the detector circuit 31 can perform detection.

Driving Circuit

The driving circuit 35 minutely adjusts a bias current according to the output signal of the modulation circuit 32 and sets a bias current to be supplied to the light source 22 (sets a central wavelength of the light emitted from the light source 22). In this way, the central wavelength of the light emitted by the light source 22 is controlled (minutely adjusted) to be stabilized by a feedback loop passing through the light source 22, the atomic cell 21, the light detector 23, the detector circuit 31, the modulation circuit 32, and the driving circuit 35. Here, the bias current adjuster 30 adjusts a current value of the bias current set by the driving circuit 35 for each period (the fourth period) corresponding to the oscillation frequency of the low-frequency oscillator 33. The adjusted period (the fourth period) is longer than a detection period (a first period) in the signal generator 40 to be described below. The feedback loop may be subjected to analog processing or may be subjected to digital processing.

The driving circuit 35 superimposes the modulated current from the automatic gain control circuit 47 to be described below on the minutely adjusted bias current, as described above, and supplies the superimposed current to the light source 22. When the light emitted from the light source 22 is subjected to frequency modulation in accordance with the modulated current, a plurality of pairs of pieces of light with frequencies deviating on both sides of the central frequency by a frequency of the modulated current are generated as the sideband light along with light with a central frequency according to the bias current.

Signal Generator

The signal generator 40 includes the detector circuit 42, the voltage controlled crystal oscillator 43, the modulation circuit 44, the low-frequency oscillator 45, and the phase synchronization circuit 46. The detector circuit 42 synchronously detects an output signal of the light detector 23 at a low frequency of a few of Hz to a few hundreds of Hz (for each first period) using an oscillated signal of the low-frequency oscillator 45 oscillated at the low-frequency. Then, the voltage controlled crystal oscillator 43 (VCXO) minutely adjusts the oscillation frequency of the voltage controlled crystal oscillator 43 (VCXO) according to a magnitude of the output signal of the detector circuit 42. The voltage controlled crystal oscillator 43 (VCXO) is oscillated at a low frequency of a few tens of Hz to a few hundreds of Hz, for example.

The modulation circuit 44 modulates an output signal of the voltage controlled crystal oscillator 43 (VCXO) using an oscillated signal of the low-frequency oscillator 45 as a modulation signal so that the detector circuit 42 can perform detection.

The phase synchronization circuit 46 converts an output signal of the modulation circuit 44 at a constant frequency conversion ratio (multiplication ratio) and outputs the converted signal. In this way, the phase synchronization circuit 46 multiplies the output of the modulation circuit 44 and generates a modulated current as a microwave signal. For example, the phase synchronization circuit 46 converts the output signal into a signal with the same frequency as ½ (9.1926 GHz/2=4.5963 GHz in the case of the cesium atoms) of a frequency difference equivalent to an energy difference between two ground levels of alkali metal atoms of a magnetic quantum number m=0 sealed in the atomic cell 21. The phase synchronization circuit 46 may convert the output signal of the modulation circuit 44 into a signal with the same frequency as a frequency difference (9.1926 GHz in the case of the cesium atoms) equivalent to an energy difference between two ground levels of alkali metal atoms of a magnetic quantum number m=0 sealed in the atomic cell 21.

The signal generator 40 configured to include the detector circuit 42, the voltage controlled crystal oscillator 43, the modulation circuit 44, the low-frequency oscillator 45, and the phase synchronization circuit 46 generates a microwave signal (modulated current) according to the transition frequency between two ground levels of the alkali metal atoms inside the atomic cell 21 based on a result obtained by detecting the detection signal of the light detector 23 for each period (first period) corresponding to the oscillation frequency of the low-frequency oscillator 45.

Automatic Gain Control Circuit

The automatic gain control circuit 47 is an amplification circuit (amplifier) that automatically adjusts an amplification factor (gain) so that the amplitude of the signal (modulated current) from the phase synchronization circuit 46 is constant. That is, the automatic gain control circuit 47 has an amplification function of amplifying the modulated current from the phase synchronization circuit 46 and an automatic gain control function of adjusting an amplification factor of the amplification function so that the amplitude of the modulated current from the phase synchronization circuit 46 becomes a preset constant amplitude. Thus, even when an installation environment (for example, a temperature or a magnetic field) of the atomic oscillator 1 varies, the modulated current with the preset constant amplitude can be obtained by removing a variation in the amplitude of the modulated current caused due to the variation in the installation environment. In particular, the automatic gain control circuit 47 adjusts the amplitude of the microwave signal from the phase synchronization circuit 46 for each period (third period) longer than the detection period (the first period) in the signal generator 40.

As illustrated, the automatic gain control circuit 47 includes an amplifier 471 (AMP), a level detector 472, and a filter 473. The amplifier 471 has a function of amplifying and outputting the modulated current from the phase synchronization circuit 46 and adjusts the amplification factor according to a signal from the filter 473. The modulated current output from the amplifier 471 is input to each of the driving circuit 35 and the level detector 472. The level detector 472 detects an output level of the modulated current from the amplifier 471 at a predetermined period (third period) and outputs a signal according to a detection result. The signal from the level detector 472 is input to the amplifier 471 via the filter 473 with a bandwidth corresponding to the detection period of the level detector 472. The configuration of the automatic gain control circuit 47 is not limited to the illustrated configuration. For example, a buffer circuit may be installed between the level detector 472 and the filter 473.

The output signal of the automatic gain control circuit 47 is input to the driving circuit 35 as a current (modulated current) of a modulation frequency fm. In this way, a pair of pieces of sideband light emitted by the light source 22 is controlled (minutely adjusted) such that the sideband light turns into a pair of pieces of resonance light producing the EIT phenomenon in the alkali metal atoms by a feedback loop passing through the light source 22, the atomic cell 21, the light detector 23, the detector circuit 42, the voltage controlled crystal oscillator 43, the modulation circuit 44, the phase synchronization circuit 46, the automatic gain control circuit 47, and the driving circuit 35. A loop bandwidth of the feedback loop is the same as the oscillation frequency of the low-frequency oscillator 45.

As described above, the EIT signal which is a steep signal generated by the EIT phenomenon is detected by the light detector 23 and the output signal of the voltage controlled crystal oscillator 43 is stabilized at a predetermined frequency using the EIT signal as a standard signal. Then, the output signal of the voltage controlled crystal oscillator 43 is output to the outside. At this time, the frequency of the output signal of the voltage controlled crystal oscillator 43 may be converted into a desired frequency at a predetermined frequency conversion ratio by, for example, a frequency conversion circuit (not illustrated) such as a direct digital synthesizer (DDS), as necessary.

As described above, in the atomic oscillator 1, the bias current adjuster 30 adjusts a current value of the bias current of the driving circuit 35 based on a detection result of the light detector 23 and the signal generator 40 adjusts the frequency of the modulated current of the driving circuit 35. The automatic gain control circuit 47 adjusts the current value (level) of the modulated current from the signal generator 40 and inputs the adjusted current value to the driving circuit 35. The signal generator 40 stabilizes the output signal of the voltage controlled crystal oscillator 43 (VCXO) at the predetermined frequency so that the above-described two pieces of sideband light and the EIT phenomenon occur by the alkali metal atoms inside the atomic cell 21, and outputs the output signal as a clock signal of the atomic oscillator 1.

Here, the light source adjuster 50 configured to include the driving circuit 35, the bias current adjuster 30, and the automatic gain control circuit 47 adjusts the frequencies of the above-described two pieces of sideband light (the first light and the second light) for each period (second period) longer than the detection period (the first period) in the signal generator 40. The adjustment period (the second period) is identical to a shorter period between the adjustment period (fourth period) in the above-described bias current adjuster 30 and the adjustment period (the third period) in the automatic gain control circuit 47.

Adjustment of Bias Current and Modulated Current

Hereinafter, adjustment of the bias current and the modulated current will be described in detail with reference to FIGS. 2 to 6.

Figure 2:
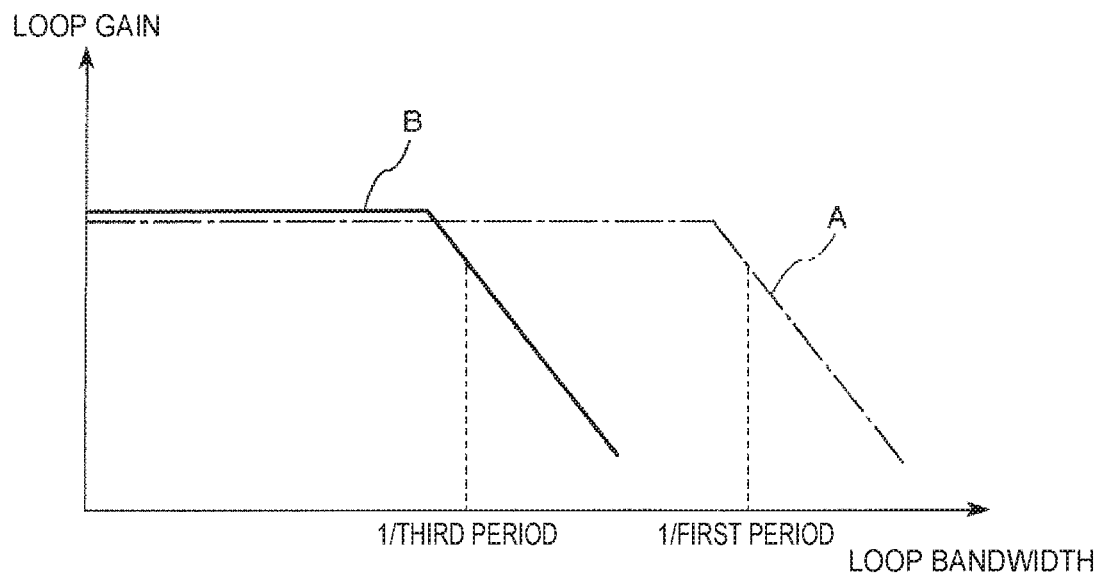
FIG. 2 is a graph illustrating a relation between a loop gain and a loop bandwidth of a control loop included in the atomic oscillator illustrated in FIG. 1.
Figure 3:
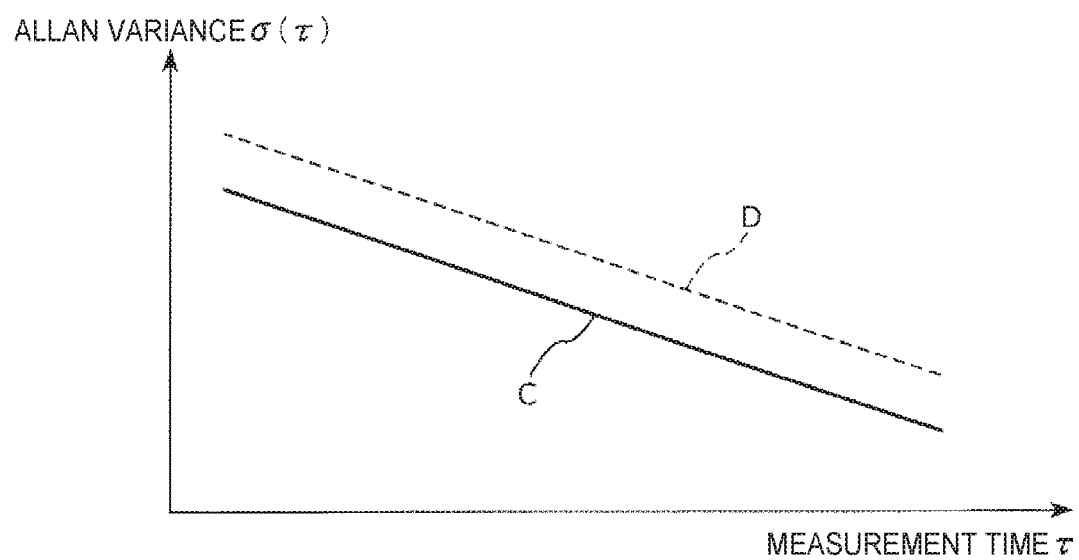
FIG. 3 is a graph illustrating a relation between Allan variance (frequency precision) and a measurement time of an output signal of the atomic oscillator illustrated in FIG. 1.
Figure 4:
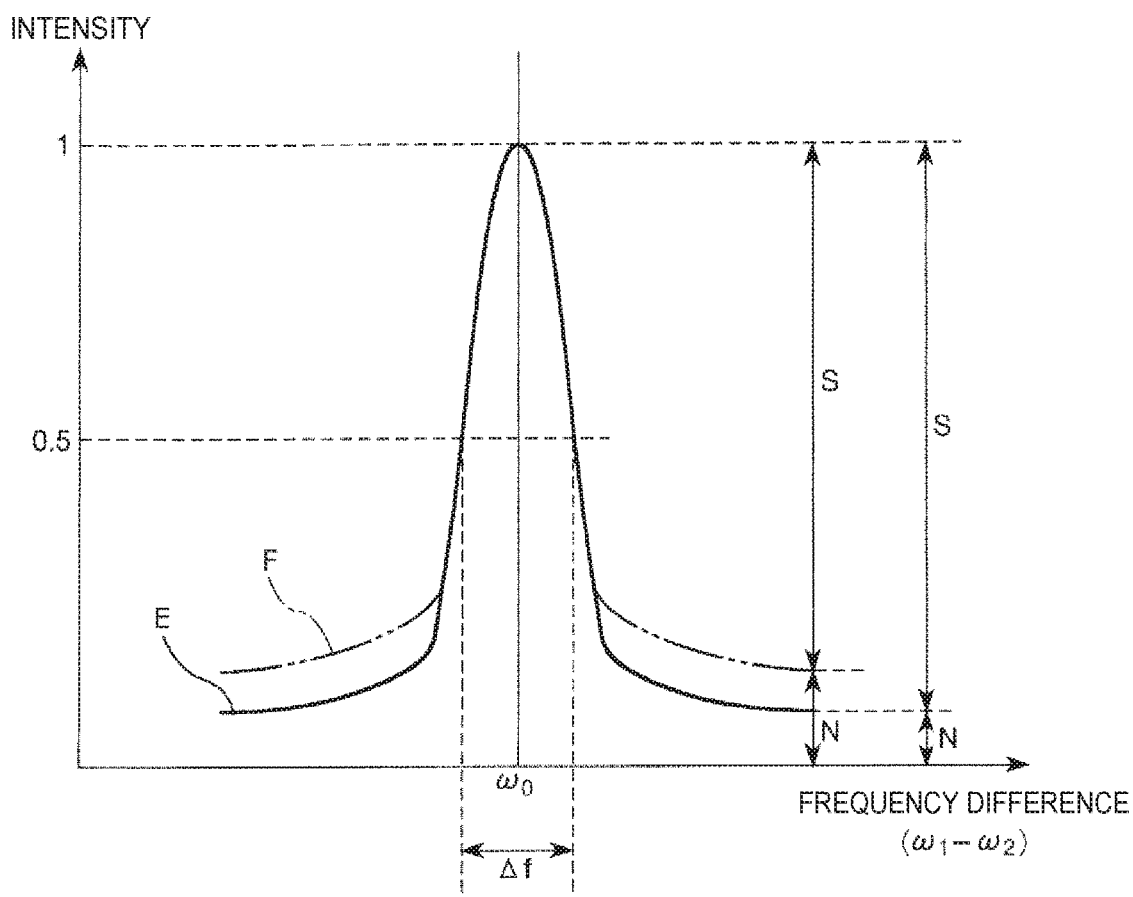
FIG. 4 is a diagram illustrating a result illustrated in FIG. 3 based on a waveform of an EIT signal.
Figure 5:
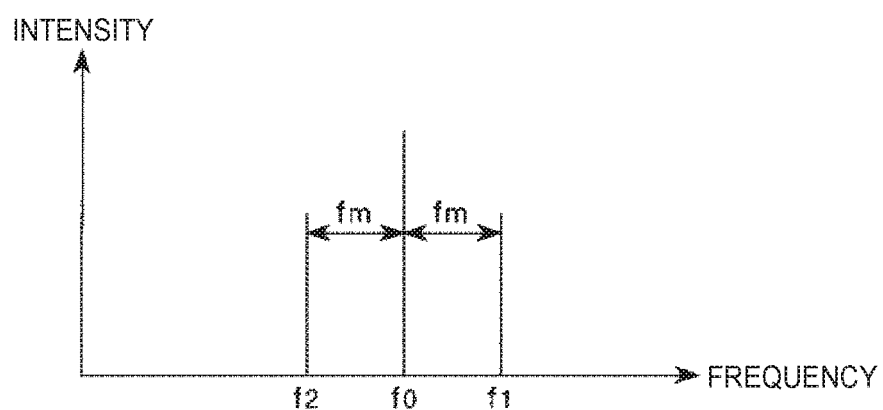
FIG. 5 is a diagram schematically illustrating a frequency spectrum of light emitted from a light source illustrated in FIG. 1.
Figure 6:
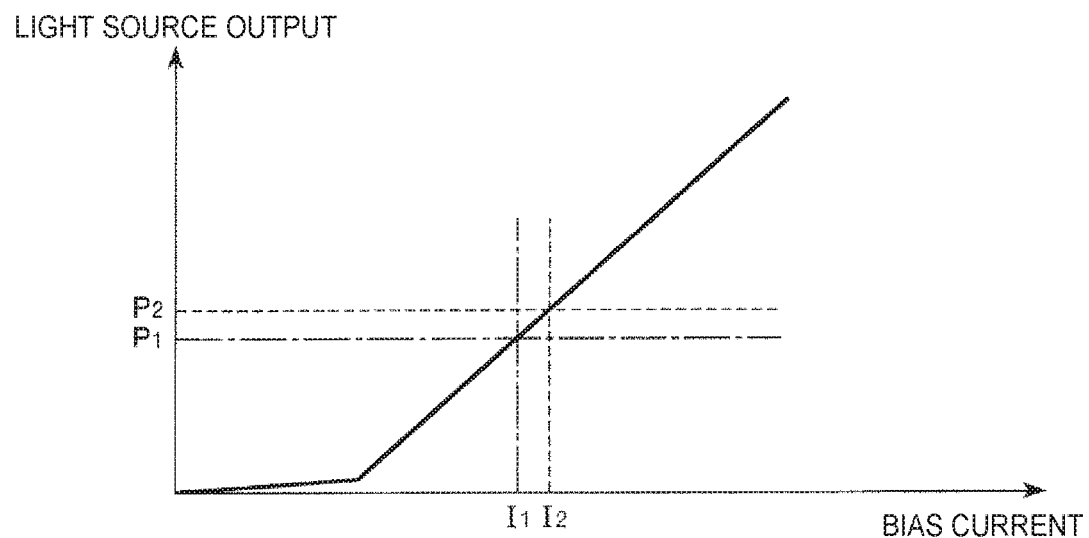
FIG. 6 is a graph illustrating an example of characteristics (a relation between a light source output and a bias current to be supplied) of the light source.

FIG. 2 is a graph illustrating a relation between a loop gain and a loop bandwidth of a control loop included in the atomic oscillator illustrated in FIG. 1. FIG. 3 is a graph illustrating a relation between Allan variance (frequency precision) and a measurement time of an output signal of the atomic oscillator illustrated in FIG. 1. FIG. 4 is a diagram illustrating a result illustrated in FIG. 3 based on a waveform of an EIT signal. FIG. 5 is a diagram schematically illustrating a frequency spectrum of light emitted from a light source illustrated in FIG. 1. FIG. 6 is a graph illustrating an example of characteristics (a relation between a light source output and a bias current to be supplied) of the light source.

As described above, the atomic oscillator 1 includes the atomic cell 21 in which the alkali metal atoms are sealed, the light source 22 that is a "light source unit" radiating the first light and the second light with mutually different frequencies to the atomic cell 21, and the light detector 23 that is a "light detection unit" detecting the first light and the second light transmitted through the atomic cell 21 and outputting a detection signal according to the detection intensity (hereinafter simply referred to as a "detection signal"). The atomic oscillator 1 includes the signal generator 40 that generates a microwave signal according to a transition frequency between two ground levels of the alkali metal atoms inside the atomic cell 21 based on a result obtained by detecting the detection signal of the light detector 23 for each first period (hereinafter simply referred to as the "first period") and the light source adjuster 50 that adjusts the frequencies of the first light and the second light from the light source 22 for each second period longer than the first period (hereinafter simply referred to as the "second period").

In the atomic oscillator 1, even when the installation environment of the atomic oscillator 1 varies, the light source adjuster 50 adjusts the frequencies of the first light and the second light from the light source 22 to stabilize these frequencies. In this way, by adjusting the frequencies of the first light and the second light from the light source 22, it is possible to reduce deterioration of the short-term frequency stability due to a variation (disturbance) of the installation environment. By causing the period (the second period) at which the frequencies of the first light and the second light are adjusted to be longer than the period (the first period) at which the signal generator 40 detects the detection signal, it is possible to reduce the deterioration in the short-term frequency stability due to the adjustment.

Here, the light source adjuster 50 includes the driving circuit 35 that drives the light source 22 by inputting the driving current obtained by superimposing the modulated current based on the microwave signal from the signal generator 40 on the bias current to the light source 22 which is the "light source unit" and the automatic gain control circuit 47 that adjusts the amplitude of the microwave signal from the signal generator 40 for each third period longer than the first period (hereinafter simply referred to as the "third period"). In this way, by stabilizing the modulated current input to the light source 22, it is possible to reduce the variation in the short-term frequency stability due to the variation (disturbance) of the installation environment. By causing the period (the third period) at which the modulated current is adjusted to be longer than the period (the first period) at which the detection signal is detected at the time of generating the microwave signal, it is possible to reduce the deterioration in the short-term frequency stability due to the adjustment.

More specifically, as illustrated in FIG. 2, a loop bandwidth of the control loop of the automatic gain control circuit 47 is less than a loop bandwidth of a feedback loop passing through the light source 22, the atomic cell 21, the light detector 23, the detector circuit 42, the voltage controlled crystal oscillator 43, the modulation circuit 44, the phase synchronization circuit 46, the automatic gain control circuit 47, and the driving circuit 35 described above (hereinafter also referred to as an "atomic resonance loop"). Here, A indicated by a one-dot chain line in FIG. 2 indicates a relation between a loop bandwidth and a loop gain in the atomic resonance loop. The loop bandwidth in the atomic resonance loop is the same as a reciprocal of the first period. In addition, B indicated by a solid line in FIG. 2 indicates a relation between a loop gain and a loop bandwidth in the control loop of the automatic gain control circuit 47. The loop bandwidth in the control loop of the automatic gain control circuit 47 is the same as a reciprocal of the third period.

When the third period is longer than the first period (C indicated by a solid line in FIG. 3), it is possible to reduce the variation in the short-term frequency stability due to disturbance and further improve the short-term frequency stability than when the third period is shorter than the first period (D indicated by a dotted line in FIG. 3), as illustrated in FIG. 3. Conversely, when the third period is shorter than the first period (D indicated by a dotted line in FIG. 3), it is possible to reduce the variation in the short-term stability due to disturbance, but the short-term frequency stability may deteriorate further than when the third period is longer than the first period (C indicated by a solid line in FIG. 3). It is considered that this is because when the third period is shorter than the first period (F indicated by a two-dot chain line in FIG. 4), adjustment by the automatic gain control circuit 47 becomes noise, and thus a noise component N increases and an S/N ratio decreases even when there is no change in a signal component S, compared to the case in which the third period is longer than the first period (E indicated by a solid line in FIG. 4).

The light source adjuster 50 includes the bias current adjuster 30 that adjusts the current value of the bias current set in the driving circuit 35 for each fourth period longer than the first period (hereinafter simply referred to as the "fourth period"). In this way, it is possible to stabilize the bias current input to the light source 22 and reduce the variation in the short-term frequency stability due to the variation (disturbance) in the installation environment. By causing the period (the fourth period) at which the bias current is adjusted to be longer than the period (the first period) at which the detection signal is detected at the time of generating the microwave signal, it is possible to reduce the deterioration in the short-term frequency stability due to the adjustment. The obtained effect is the same as the effect obtained by causing the third period to be longer than the first period.

The third period preferably differs from the fourth period from the viewpoint of control easiness. A magnitude relation between the periods can be decided according to, for example, the characteristics in the light source 22. When linearity of the output characteristics of the light source with respect to the bias current is relatively high (nonlinearity is relatively low), the fourth period is preferably shorter than the third period. In this way, it is possible to effectively reduce a variation in the central wavelength of the light from the light source 22. As a result, it is possible to improve stability of the wavelengths of the first light and the second light. More specifically, as illustrated in FIG. 5, the light source 22 emits light with a central frequency f0 according to the current value of the bias current and two pieces of sideband light (the first light and the second light) with frequencies f1 and f2 shifted by a frequency fm of the modulated current on both sides of the central frequency f0 of the light. When the fourth period is shorter than the third period, it is possible to first stabilize the central frequency f0 and stabilize the frequencies f1 and f2 from this state. Therefore, it is possible to further reduce the shift of the central frequency f0.

Conversely, when the nonlinearity of the output characteristics of the light source 22 with respect to the bias current is relatively high (the linearity is relatively low), the fourth period is preferably longer than the third period. In this way, it is possible to effectively reduce a variation in the central wavelength of the light from the light source 22. As a result, it is possible to improve stability of the wavelengths of the first light and the second light. More specifically, for example, as illustrated in FIG. 6, when the nonlinearity of the output characteristics of the light source 22 with respect to the bias current is relatively high and the microwave signal varies, the bias current is accordingly changed from I1 to I2 of the light source 22, which results in the change of the output of the light source from P1 to P2. Thus, it is difficult to stably adjust the bias current. Accordingly, by causing the fourth period to be longer than the third period, it is possible to first stabilize the microwave signal. As a result, it is possible to stably adjust the bias current.

As described above, when the third period differs from the fourth period and the third period and the fourth period are set to T3 [seconds] and T4 [seconds], respectively, from the viewpoint of control easiness or the like, and T3/T4 is preferably equal to or greater than 0.1 and equal to or less than 10 and is more preferably equal to or greater than 0.5 and equal to or less than 2.0.

As described above, the second period is a period longer than the first period and is identical to a shorter period between the third and fourth periods. The second period is preferably equal to or less than (0.1/T) second when the installation environment temperature of the atomic oscillator 1 varies at a variation speed T [° C./second]. In this way, it is possible to reduce a variation in the short-term frequency stability due to the variation in the installation environment temperature.

The first period is preferably equal to or greater than 1/150 seconds and equal to or less than 1/50 seconds. That is, the loop bandwidth in the atomic resonance loop is preferably equal to or greater than 50 Hz and equal to or less than 150 Hz. In this way, the signal generator 40 can appropriately generate a microwave signal.

Further, the second period is preferably equal to or less than 1 second. That is, the frequency adjusted by the bias current adjuster 30 and the frequency adjusted by the automatic gain control circuit 47 are preferably equal to or greater than 1 Hz. In this way, it is possible to reduce the variation in the short-term frequency stability due to the variation in a general installation environment.

Second Embodiment

Next, a second embodiment will be described.

Figure 7:
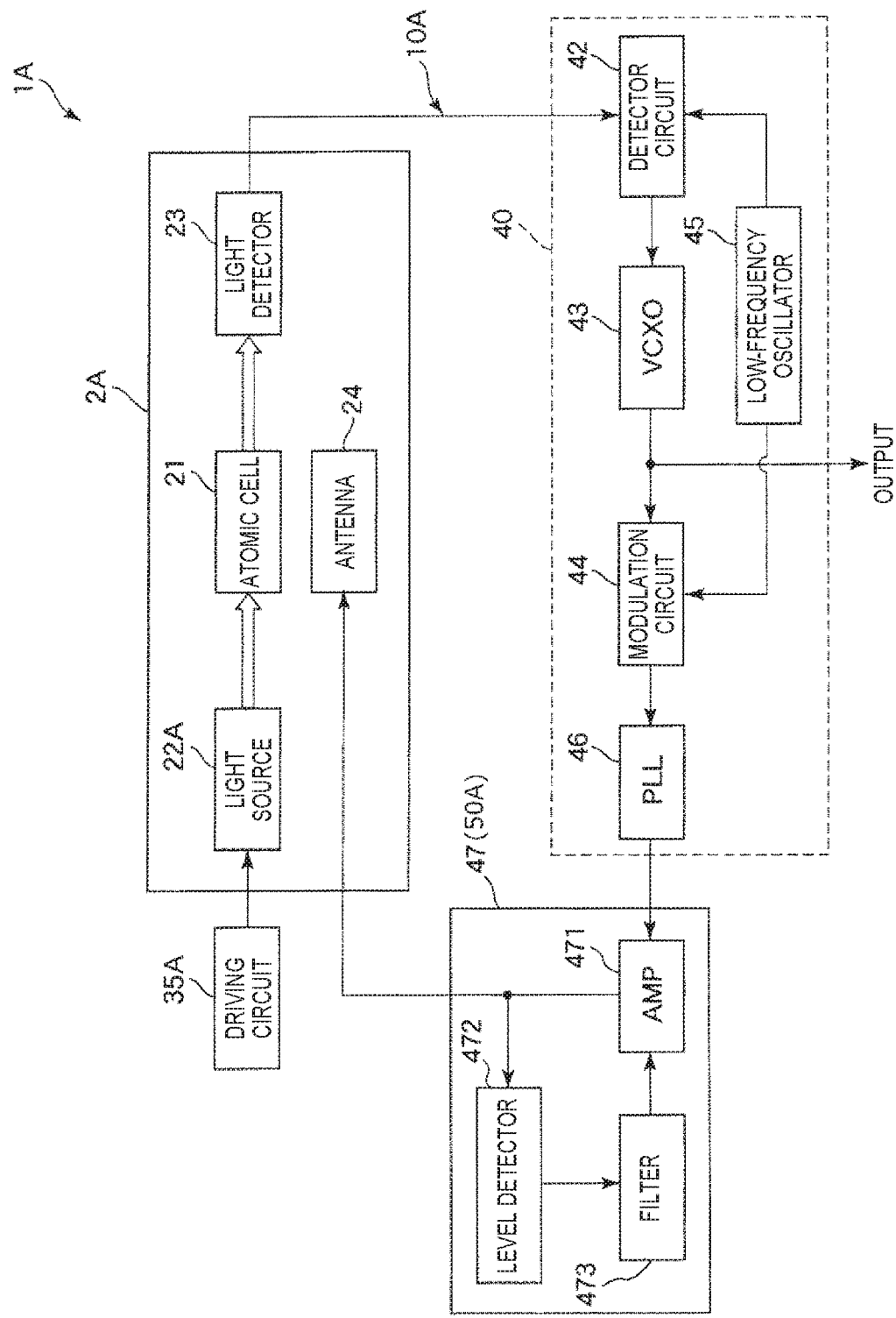
FIG. 7 is a schematic diagram illustrating an overall configuration of an atomic oscillator according to a second embodiment.

FIG. 7 is a schematic diagram illustrating an overall configuration of an atomic oscillator according to a second embodiment.

The embodiment is the same as the above-described first embodiment except that the invention is applied in an optical microwave double resonance scheme.

In the following description, differences between the second embodiment and the first embodiment will be mainly described and the description of the same matters will be omitted. In FIG. 7, the same reference numerals are given to the same configurations as those of the above-described embodiment.

An atomic oscillator 1A illustrated in FIG. 7 is an atomic oscillator that oscillates based on energy transition of alkali metal atoms such as rubidium using the optical microwave double resonance phenomenon. Here, the optical microwave double resonance phenomenon is a phenomenon generated when resonance light that has a frequency equivalent to an energy difference between the first ground level and the excited level and a microwave that has a frequency equivalent to an energy difference between the first and second ground levels are radiated to the alkali metal atoms at the same time.

The atomic oscillator 1A includes a package unit 2A and a controller 10A electrically connected to the package unit 2A.

The package unit 2A includes a light source 22A (light source unit), an atomic cell 21 (gas cell), a light detector 23 (light detection unit), and an antenna 24 which are accommodated in a package (not illustrated).

The light source 22A is, for example, a lamp in which an alkali metal is sealed. A semiconductor laser such as a vertical cavity surface emitting laser (VCSEL) can be used as the light source 22A.

The antenna 24 has a function of releasing (radiating) microwaves to be radiated to the alkali metal atoms inside the atomic cell 21. The antenna 24 is not particularly limited as long as microwaves can be released. Any of various antennas can be used. For example, the antenna 24 includes a substrate formed of a dielectric material and a radiation pattern and a reflector installed on the surface of the substrate and formed of a conductive material.

In the embodiment, the atomic cell 21 and the antenna are accommodated inside a cavity (not illustrated) configured such that stationary waves with a frequency equivalent to the energy difference between the first and second ground levels of the alkali metal atoms are generated. Accordingly, when the frequency of the microwave from the antenna 24 becomes the frequency equivalent to the energy difference between the first and second ground levels of the alkali metal atoms, the microwave from the antenna 24 is resonated inside the cavity.

The controller 10A controls the frequency of the microwave released from the antenna 24 such that the optical microwave double resonance phenomenon is produced based on a detection result of the light detector 23. The controller 10A includes a driving circuit 35A, a signal generator 40, and an automatic gain control circuit 47.

The driving circuit 35A drives the light source 22A so that the frequency of light from the light source 22A becomes the frequency equivalent to the energy difference between the first ground level and the excited level of the alkali metal atoms. In the embodiment, a modulated current from the automatic gain control circuit 47 is supplied to the antenna 24. Here, the automatic gain control circuit 47 is a microwave adjuster 50A that adjusts the amplitude of the microwave from the antenna 24 for each second period longer than the first period.

The atomic oscillator 1A that has the foregoing configuration includes an atomic cell 21 in which alkali metal atoms are sealed, a light source 22A which is a "light source unit" radiating light to the atomic cell 21, and a light detector 23 which is a "light detection unit" detecting the light transmitted through the atomic cell 21 and outputting a detection signal according to a detected intensity. In particular, the atomic oscillator 1A includes a signal generator 40 that generates a microwave signal according to the transition frequency between two ground levels of the alkali metal atoms inside the atomic cell 21 based on a result obtained by detecting the detection signal for each first period, the antenna 24 that radiates the microwave to the atomic cell 21 when a signal based on the microwave signal from the signal generator 40 is input, and the microwave adjuster 50A that adjusts the amplitude of the microwave from the antenna 24 for each second period longer than the first period.

Since the atomic oscillator 1A adjusts the amplitude of the microwave from the antenna 24, it is possible to reduce the deterioration in the short-term frequency stability due to a variation (disturbance) in the installation environment. By causing the period (the second period) at which the amplitude of the microwave from the antenna 24 is adjusted to be longer than the period (the first period) at which the signal generator 40 detects a detection signal, it is possible to reduce the deterioration in the short-term frequency stability due to the adjustment.

According to the above-described second embodiment, it is also possible to reduce the deterioration in the short-term frequency stability even when the installation environment of the atomic oscillator 1A varies.

2. Electronic Apparatus

Hereinafter, an electronic apparatus will be described.

Figure 8:
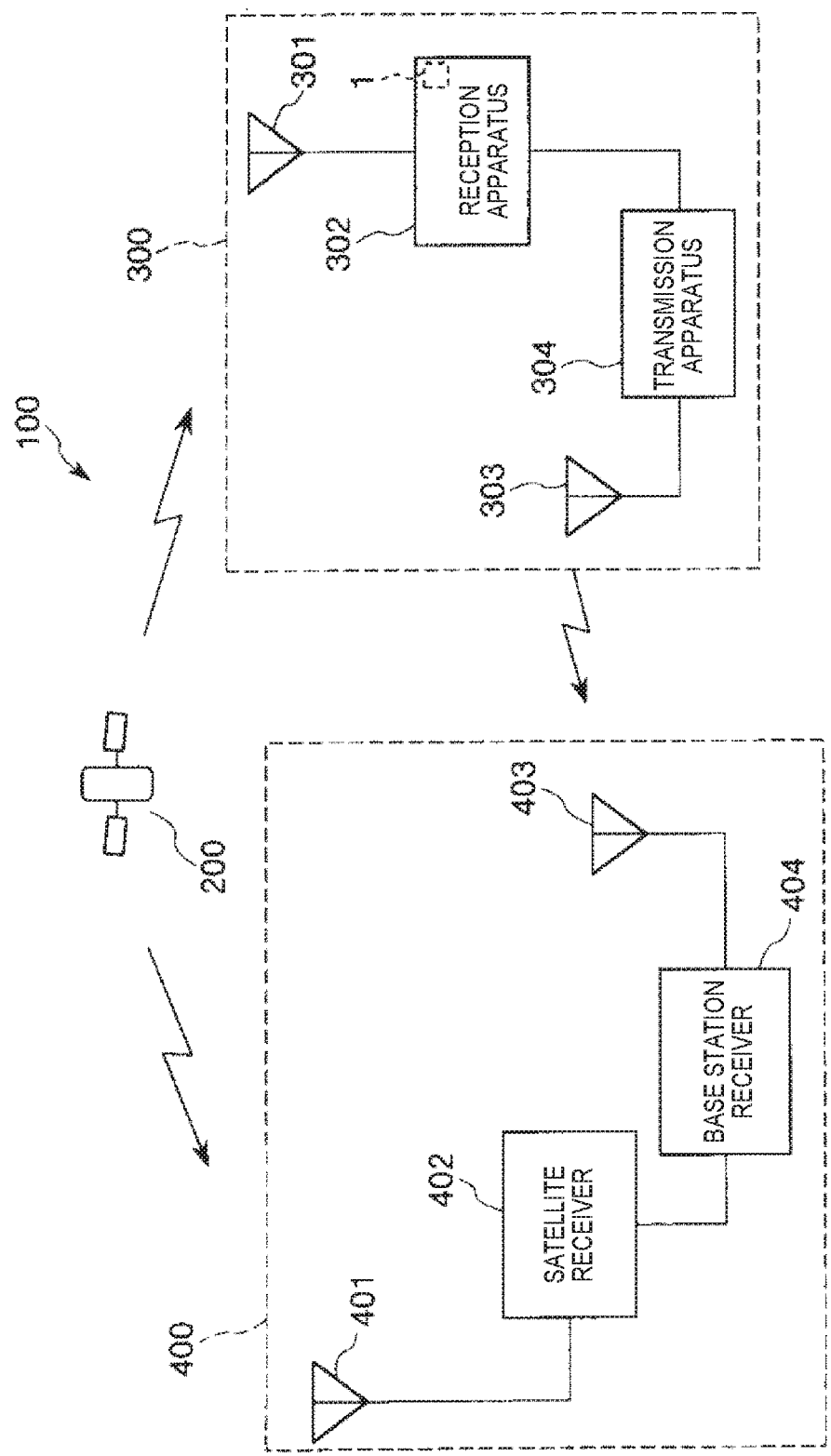
FIG. 8 is a diagram illustrating an embodiment of an electronic apparatus.

FIG. 8 is a diagram illustrating an embodiment of an electronic apparatus.

A positioning system 100 (electronic apparatus) illustrated in FIG. 8 is configured to include a GPS satellite 200, a base station apparatus 300, and a GPS reception apparatus 400.

The GPS satellite 200 transmits positioning information (a GPS signal).

The base station apparatus 300 includes a reception apparatus 302 that receives the positioning information with high precision from the GPS satellite 200 via an antenna 301 installed at, for example, an electronic standard point (GPS continuous observation station) and a transmission apparatus 304 that transmits the positional information received by the reception apparatus 302 via an antenna 303.

Here, the reception apparatus 302 is an electronic apparatus that includes the above-described atomic oscillator 1 as a standard frequency oscillation source. The reception apparatus 302 has excellent reliability. The positional information received by the reception apparatus 302 is transmitted in real time by the transmission apparatus 304.

The GPS reception apparatus 400 includes a satellite receiver 402 that receives the positioning information from the GPS satellite 200 via an antenna 401 and a base station receiver 404 that receives the positional information from the base station apparatus 300 via an antenna 403.

The reception apparatus 302 which is an "electronic apparatus" included in the above-described positioning system 100 includes the atomic oscillator 1, as described above. As described above, the atomic oscillator 1 can reduce the deterioration in the short-term frequency stability even when the installation environment varies. Therefore, by using a signal for high frequency stability regardless of the installation environment of the reception apparatus 302, the reception apparatus 302 can function highly. The reception apparatus 302 may include the atomic oscillator 1A instead of the atomic oscillator 1 or in addition to the atomic oscillator 1.

The electronic apparatus including the atomic oscillator according to the invention is not limited to the above-described electronic apparatus. The invention can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscopy), a fish finder, various measurement apparatuses, meters (for example, meters for cars, airplanes, and ships), a flight simulator, a digital terrestrial broadcast, and a mobile phone base station.

3. Vehicle

Figure 9:
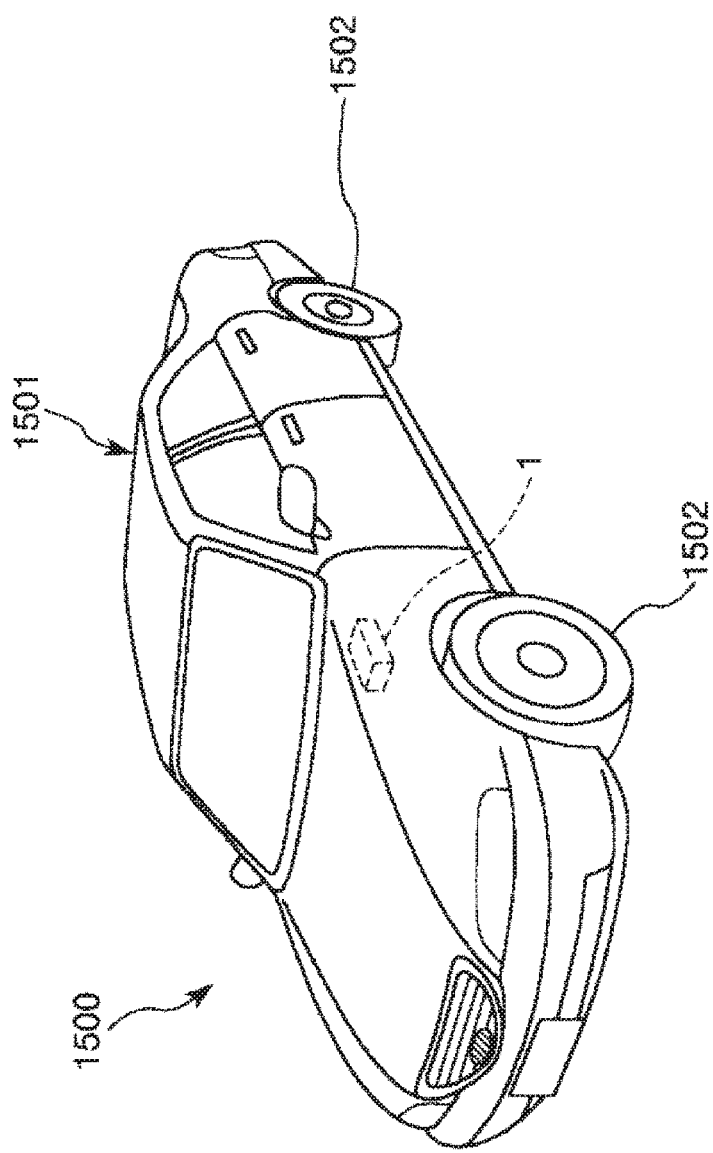
FIG. 9 is a diagram illustrating an embodiment of a vehicle.

FIG. 9 is a diagram illustrating an embodiment of a vehicle.

In the drawing, a vehicle 1500 includes a body 1501 and four wheels 1502 and is configured to rotate the wheels 1502 by a power source (engine) (not illustrated) installed in the body 1501. The vehicle 1500 contains the atomic oscillator 1.

The above-described vehicle 1500 includes the atomic oscillator 1, as described above. As described above, the atomic oscillator 1 can reduce deterioration of short-term frequency stability even when an installation environment varies. Therefore, the vehicle 1500 can function highly using a signal for high frequency stability regardless of the position of the vehicle 1500. The vehicle 1500 may include the atomic oscillator 1A instead of the atomic oscillator 1 or in addition to the atomic oscillator 1.

The atomic oscillator, the electronic apparatus, and the vehicle have been described above according to the illustrated embodiments, but the invention is not limited thereto.

The configuration of each unit of the atomic oscillator, the electronic apparatus, and the vehicle can be substituted with any configuration that has the same function. Any configuration can be added.

This application claims priority to Japanese Patent Application No. 2016-174979 filed Sep. 7, 2016, the entirety of which is expressly incorporated herein by reference.

What is claimed is:

1. An atomic oscillator comprising:
    an atomic cell in which alkali metal atoms are sealed;
    a light source configured to radiate first light and second light to the atomic cell, the first light having a first frequency, the second light having a second frequency that is different from the first frequency;
    a light detector configured to detect an intensity of each of the first light and the second light transmitted through the atomic cell so as to output a light-detection signal;
    a first oscillator configured to provide a first oscillation frequency;
    a second oscillator configured to provide a second oscillation frequency,
    a signal generator configured to generate a microwave signal according to a transition frequency between two ground levels of the alkali metal atoms based on a wave-detection result, the wave-detection result being obtained by wave-detecting the light-detection signal at every cycle of the first oscillation frequency;
    a bias current adjuster configured to adjust a value of a bias current at every cycle of the second oscillation frequency, the bias current controlling a central wavelength between the first light and the second light radiated from the light source; and
    a driving circuit configured to supply a driving current to the light source, the driving current being obtained by superimposing a modulation current on the bias current, the modulation current being obtained based on the microwave signal,
    wherein a period of one cycle of the second oscillation frequency is longer than a period of one cycle of the first oscillation frequency.

2. The atomic oscillator according to claim 1,
    wherein the period of one cycle of the first oscillation frequency is equal to or greater than $1/150$ seconds and equal to or less than $1/50$ seconds.

3. A control method of an atomic oscillator, the method comprising:
    emitting first sideband light and second sideband light from a light source, the first sideband light having a first frequency, the second sideband light having a second frequency that is different from the first frequency;
    transmitting the first sideband light and the second sideband light through an atomic cell in which alkali metal atoms are sealed;
    detecting an intensity of each of the first sideband light and the second sideband light transmitted through the atomic cell;
    outputting a light-detection signal based on the detected intensity of each of the first sideband light and the second sideband light;
    providing a first oscillation frequency from a first oscillator;
    providing a second oscillation frequency from a second oscillator;
    generating a microwave signal based on a wave-detection result, the wave-detection result being obtained by wave-detecting the light-detection signal at every cycle of the first oscillation frequency;
    adjusting a value of a bias current at every cycle of the second oscillation frequency, the bias current controlling a central wavelength between the first sideband light and the second sideband light; and
    supplying a driving current to the light source, the driving current being obtained by superimposing a modulation current on the bias current, the modulation current being obtained based on the microwave signal,
    wherein a period of one cycle of the second oscillation frequency is longer than a period of one cycle of the first oscillation frequency.

4. The control method of an atomic oscillator according to claim 3,
    wherein the period of one cycle of the first oscillation frequency is equal to or greater than $1/150$ seconds and equal to or less than $1/50$ seconds.

* * * * *